United States Patent
Kuo et al.

(10) Patent No.: US 6,859,150 B2
(45) Date of Patent: Feb. 22, 2005

(54) APPARATUS FOR READING KEYBOARD-COMMANDS OF A PORTABLE COMPUTER

(75) Inventors: Hubert Kuo, Shindian (TW); Yu-Bin Cho, Shinjuang (TW); I-Ming Lin, Shindian (TW)

(73) Assignee: Via Technologies, Inc., Taipei (TW)

( * ) Notice: Subject to any disclaimer, the term of this patent is extended or adjusted under 35 U.S.C. 154(b) by 462 days.

(21) Appl. No.: 10/140,994

(22) Filed: May 9, 2002

(65) Prior Publication Data

US 2002/0180623 A1 Dec. 5, 2002

(30) Foreign Application Priority Data

May 29, 2001 (TW) ........................................ 90112972 A

(51) Int. Cl.[7] .............................................. H03K 17/94
(52) U.S. Cl. ............................ 341/26; 341/22; 379/368
(58) Field of Search .................. 341/22, 26; 340/407.2; 379/368; 714/51, 702, 726, 735

(56) References Cited

U.S. PATENT DOCUMENTS 4,502,039 A * 2/1985 Vercesi et al. ................ 341/26
4,675,653 A * 6/1987 Priestley ....................... 341/26

FOREIGN PATENT DOCUMENTS

| JP | 57-114935 | 7/1982 |
| JP | 3005222 | 10/1994 |
| JP | 2-27831 | 8/2000 |

* cited by examiner

Primary Examiner—Michael Horabik
Assistant Examiner—Hung Dang
(74) Attorney, Agent, or Firm—Rabin & Berdo, P.C.

(57) ABSTRACT

A new apparatus for reading keyboard-commands of a portable computer comprises a shift register, a keyboard-matrix circuit, a filter, a buffer, an address generator, a mapping device, a comparator, and an output device. The shift register is for outputting a plurality of scan-input signals and a reference signal. The keyboard-matrix circuit is for outputting a scan-output signal according to the scan-input signals. The keyboard-matrix circuit includes a plurality of nodes corresponded to the keyboard buttons, respectively. The filter is for filtering the noise of the scan-output signal. The buffer is for further stabilizing the filter signal. The address generator is for reading the location of the node corresponding to the button being pressed. The mapping device is for outputting a mapping signal corresponding to the button being pressed. The comparator is for outputting a comparing signal, which represents the command corresponded to the pressed button. The output device is for outputting a data clock signal and a data output signal serially according to the comparing signal.

27 Claims, 9 Drawing Sheets

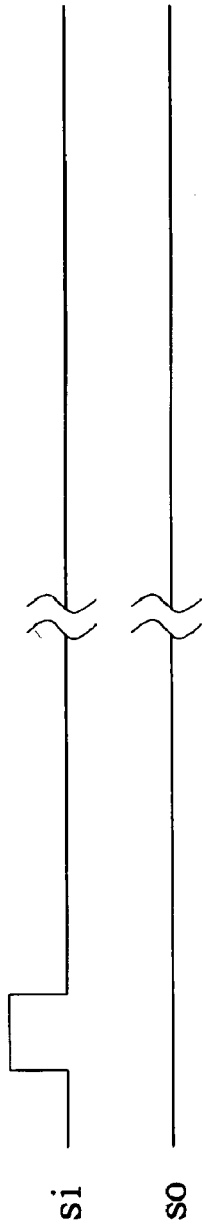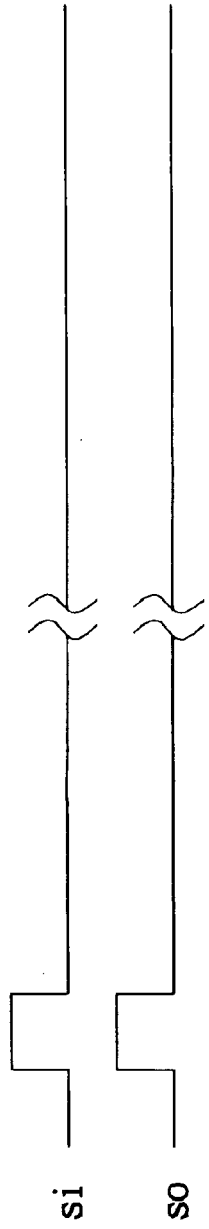
FIG. 5A (PRIOR ART)
FIG. 5B (PRIOR ART)

APPARATUS FOR READING KEYBOARD-COMMANDS OF A PORTABLE COMPUTER

This application incorporates by reference Taiwanese application Serial No. 090112972, filed May 29, 2001.

BACKGROUND OF THE INVENTION

1. Field of the Invention

The invention relates in general to an apparatus for reading signals, and more particularly to an apparatus for reading keyboard-commands of a portable computer.

2. Description of the Related Art

In the past few years, the development of the portable computer technology has been very vigorous. Because of its high mobility, the portable computer, commonly called the notebook computer, has become an indispensable tool for the business individual.

In the computer system, the peripheral input/output device connects the user and the computer host. The user can input commands into the computer host through the peripheral input device. Each command may be a character or a function. After receiving the commands, the computer host will operate according to the commands. Among all of the present peripheral input devices of the computer system, the keyboard is the most essential device. A keyboard comprises a number of keyboard buttons and each keyboard button corresponds to a command. Therefore, each keyboard button corresponds to a character or a function. In addition to the keyboard buttons, the keyboard also includes an apparatus for reading keyboard-commands. When the user pressing down the keyboard button, the apparatus for reading keyboard-commands can output a digital signal corresponded to the keyboard button from the keyboard to the computer host. The computer host will operate according to the command given by the user through pressing down the keyboard buttons of the keyboard. Therefore, the apparatus for reading keyboard-commands is used for transferring an input command to the corresponding digital signal and delivering the digital signal to the computer host.

FIG. 1 shows a block diagram of a conventional apparatus for reading the keyboard-commands of the portable computer. In the portable computer system, the keyboard is controlled by an embedded controller (EC) 102. The embedded controller 102 is substantially a microprocessor, which comprises a number of internal devices such as a read-only memory (ROM), a random access memory (RAM), registers, and an input/output interface. By designing complicated command codes in the embedded controller 102, the embedded controller 102 is capable of performing various complicated functions according to an external clock signal (CK). The conventional apparatus for reading keyboard-commands comprises an embedded controller 102, a decoder 104, and a multiplexer 106, as shown in FIG. 1.

The process of reading the keyboard-commands by the conventional apparatus is briefly described as follows. The clock signal (CK) is inputted to the decoder 104. Therefore, the decoder 104 can operate synchronously with the embedded controller 102. The embedded controller 102 outputs the control signals (cs) to the decoder 104 periodically. Each of the control signals is a four-bit digital signal. The embedded controller 102 outputs one of the control signals each clock period according to the clock signal (CK). The magnitude of the control signals (cs) outputted from the embedded controller 102 respectively is in an increasing order from $(0000)_2$ to $(1111)_2$ in binary format, or from 0 to 15 in decimal format. The first control signal (cs) $(0000)_2$ is outputted in the first clock period when the embedded controller 102 receives the first clock signal (CK). The second control signal (cs) $(0001)_2$ is outputted in the second clock period when the embedded controller 102 receives the second clock signal (CK). All other control signals (cs) are outputted in turn in this manner, until the last control signal (cs) $(1111)_2$ is outputted from the embedded controller 102. Then in the next clock period, the control signal (cs) outputted from the embedded controller 102 is back to $(0000)_2$ again. The embedded controller 102 periodically outputs the control signals (cs) to the decoder 104 in the method described above. The decoder 104 includes 4 control signal input nodes (CS) coupled to the corresponding control signal output node (EO) of the embedded controller 102 respectively. When the embedded controller 102 outputs the control signal (cs), each bit of the control signal (cs) is outputted in parallel from the corresponding signal output node (EO) of the embedded controller 102 to the corresponding signal input node (CS) of the decoder 104.

FIG. 2 shows the timing chart of the scan-input signals outputted from the decoder 104. The decoder 104 includes 16 signal output nodes labeled SO0, SO1, SO2, . . . , and SO15, respectively, as shown in FIG. 1. The decoder 104 is used for outputting the scan-input signal (si) from the corresponding signal output node (SO) according to the control signal (cs) received in the clock period. The decoder 104 receives the control signals (cs) in increasing order from $(0000)_2$ to $(1111)_2$ in binary format, or from 0 to 15 in decimal format, periodically. Upon receiving the control signal (cs) $(0000)_2$, the decoder 104 outputs the scan-input signal (si) from the first signal output node (SO0). Upon receiving the control signal (cs) $(0001)_2$, the decoder 104 outputs the scan-input signal (si) from the second signal output node (SO1). The scan-input signal (si) is outputted from the corresponding signal output nodes (SO) of decoder 104 periodically for each clock period in the method described above. Therefore, the phase of each scan-input signal (si) outputted from the decoder 104 is different. The timing chart of the scan-input signals (si) outputted from 16 signal output nodes (SO) of the decoder 104 respectively is shown in FIG. 2.

FIGS. 3A–3B show the diagram of the keyboard-matrix circuit 108 of the conventional apparatus for reading keyboard-commands of the portable computer 100. The keyboard-matrix circuit 108 of the keyboard comprises 16 horizontal circuit lines 302 and 8 vertical circuit lines 304 set on a soft pad. Each horizontal circuit line 302 perpendicularly intersects each vertical circuit line 304 to form each node 306 respectively, as shown in FIG. 3A. Therefore, the keyboard-matrix circuit includes 128 nodes 306. Each horizontal circuit line 302 is perpendicular to each vertical circuit line 304, respectively, without coupling to each other directly, as shown in FIG. 3B.

FIGS. 4A–4B show the cross-sectional view of the node in the keyboard-matrix circuit. The location of each keyboard button 401 is corresponded to a node 306 in the keyboard-matrix circuit. The bottom of each keyboard button 401 comprises a layer of electrically conductive black lead 402. In the normal situation, the keyboard button 401(1) is not pressed down and the horizontal circuit line 302 and the vertical circuit line 304 are disconnected from each other, as shown in FIG. 4A. However, when the keyboard button 401(2) is pressed down by the user, the black lead layer 402 in the bottom of the pressed keyboard button 401(2) is connected to the horizontal circuit line 302 and the vertical circuit line 304 respectively, as shown in FIG. 4B. Because the black lead layer 402 is electrically conductive, the horizontal circuit line 302 and the vertical circuit line 304 are electrically coupled to each other through the black lead layer 402 when the keyboard button 401(2) is pressed down. To sum up, the horizontal circuit line 302 and the vertical circuit line 304 in the keyboard-matrix circuit 108 are not coupled to each other directly in the normal situation when the keyboard button 401 is not pressed down. But when the keyboard button 401 is pressed down, the horizontal circuit line 302 and the vertical circuit line 304 in the keyboard-matrix circuit 108 are electrically coupled to each other through the black lead layer 402 of the pressed keyboard button 401. This form of coupling relation between the horizontal circuit line 302 and the vertical circuit line 304 is called normally open. Each horizontal circuit line 302 is coupled in the form of normally open to each vertical circuit line 304, respectively.

FIGS. 5A~5B show the timing chart of the scan-input signal (si) and the scan-output signal (so) corresponding to the nodes 401(1) and 401(2), respectively, as shown in FIGS. 4A~4B. If the keyboard button 401(1) of the node 306 is not pressed down, as shown in FIG. 4A, the horizontal circuit line 302 and the vertical circuit line 304 in the keyboard-matrix circuit 108 are not electrically coupled to each other and the keyboard-matrix circuit 108 will not output the scan-output signal (so) according to the scan-input signal (si). The timing chart of the scan-input signal (si) and the scan-output signal (so) in this situation is shown in FIG. 5A. If the keyboard button 401(2) of the node 306 is pressed down, as shown in FIG. 4B, the horizontal circuit line 302 and the vertical circuit line 304 in the keyboard-matrix circuit 108 are electrically coupled to each other through the black lead layer 402 of the keyboard button 401(2) and a scan-output signal (so) is outputted from the decoder 104 according to the scan-input signal (si). The timing chart of the scan-input signal (si) and the scan-output signal (so) in this situation is shown in FIG. 5B.

FIG. 6 shows the timing chart of the scan-input signals (si) and the scan-output signals (so) of the keyboard-matrix circuit when one of the keyboard buttons is pressed down. For example, if one of the keyboard buttons is pressed down and the node corresponding to the pressed keyboard button comprises the third horizontal circuit line and the fourth vertical circuit line, the scan-input signal (si2) outputted from the third signal output node (SO2) of the decoder 104 is delivered through the third horizontal circuit line, and the layer of black lead of the pressed keyboard button to the fourth vertical circuit line. Therefore, the scan-output signal (so3) is outputted from the fourth vertical circuit line of the keyboard-matrix circuit, as shown in FIG. 6.

The clock signal (CK) is inputted to the multiplexer 106. Therefore, the multiplexer 106 can operate synchronously with the embedded controller 102. The multiplexer 106 includes 8 signal input nodes (SI). Each signal input node is coupled to the corresponding vertical circuit line of the keyboard scan matrix 108 respectively. The scan-output signal (so) is outputted from one of the vertical circuit lines to the corresponding signal input node of the multiplexer 106. When receiving the scan-output signal (so), the multiplexer 106 will deliver a multiplexer output signal (sm) to the embedded controller 102 to tell the embedded controller 102 which signal input node (SI) of the multiplexer 106 receives the scan-output signal (so) outputted from the keyboard-matrix circuit 108.

The embedded controller 102 knows which vertical circuit line is electrical-conductive according to the multiplexer output signal (sm) and which horizontal circuit line is electrically-conductive according to the time that the embedded controller 102 receives the multiplexer output signal (sm). Because the embedded controller 102, the decoder 104, and the multiplexer 106 operate synchronously according to the same clock signal (CK), the embedded controller 102 can know the address of electrically-conductive horizontal circuit line according to the time of receiving the multiplexer output signal (sm). Therefore, the embedded controller 102 can know the address of the pressed keyboard button in the keyboard-matrix circuit in this manner. Then, the embedded controller 102 outputs a command data signal (SDATA) corresponding to the pressed keyboard button. The corresponding relation between the keyboard button and the command data signal is stored in the memory of the embedded controller 102 in advance. The command data signal (SDATA) is outputted serially to the computer host. The conventional apparatus for reading keyboard-commands of a portable computer operates in the above-mentioned manner to transfer an input command given by the user to the corresponding digital command data signal and then to deliver the command data signal to the computer host.

The conventional apparatus for reading keyboard-commands of the portable computer has the following disadvantages. First, the embedded controller is substantially a central processing unit (CPU). By designing complicated command sets in the embedded controller, the embedded controller is capable of performing more complicated functions than that of the common logic circuit. Therefore, the embedded controller is much more expensive than the common logic circuit. However, it is unnecessary to use such a complicated embedded controller to execute the keyboard-command reading task. Instead of the embedded controller, the keyboard-command reading task can be executed by properly designed logic devices.

Second, the conventional apparatus for reading keyboard-commands is controlled by the computer host through the basic input/output system (BIOS). The manufacturer of the portable computer must pay the royalty to the manufacturer of the BIOS in order to get the license for using the command codes of the BIOS. After getting the license, the manufacturer of the portable computer must design software command codes according to the command codes of the BIOS to control the embedded controller's execution of the keyboard-commands reading task. In addition, the memory capacity of the ROM and RAM in the embedded controller is limited. External memory must be used when the embedded controller executes the keyboard-commands reading task. The software command codes must be designed for the embedded controller to control the external memory executing the keyboard-commands reading task. Therefore, the time and money cost is high when using the embedded controller to execute the keyboard-commands reading task.

Third, the embedded controllers manufactured by different manufacturers are incompatible. Each manufacturer of the portable computer usually cooperates with one of the embedded controller manufacturers in order to decrease the cost of royalty and software command codes designing. However, the embedded controller manufacturers are fewer than the portable computer manufacturers, and the embedded controllers supplied by the embedded controller manufacturer are limited. When the demand for the portable computer manufacturers increases, the embedded controller manufacturer can supply only a limited number of embedded controllers to each portable computer manufacturer. The shortage of the embedded controller supply happens unpredictably and it has a great influence on the output number of the portable computer products of the portable computer manufacturers. If the shortage of the embedded controller supply occurs, the portable computer manufacturers have no choice, but to change to the embedded controller manufactured by another manufacturer. Additional time and money cost must be paid by the manufacturer of the portable computer for the design of new software command codes to control the new embedded controller.

Fourth, in addition to delivering the keyboard-commands of the portable computer, the embedded controller has other tasks, such as delivering the power status of the smart battery or controlling the CD drive playing. Therefore, the performance and efficiency of the embedded controller in executing the keyboard-commands reading task may not be sufficient because the embedded controller has to execute many other tasks at the same time.

To sum up, the conventional apparatus for reading the keyboard-commands of the portable computer has the following disadvantages. First, the embedded controller is relatively expensive. Second, the embedded controllers manufactured by different manufacturers are incompatible. Third, the shortage of the embedded controller supply occurs unpredictably and the cost of changing to a new embedded controller is high. Fourth, the performance and efficiency of the embedded controller is not sufficient in executing the keyboard-commands reading task.

SUMMARY OF THE INVENTION

It is therefore an object of the invention to provide an improved and simplified apparatus for reading the keyboard-commands of the portable computer so as to achieve the following objectives: first, to decrease the time and the money cost of the portable computer manufacturer; second, to solve the problem of unpredictable shortage of embedded controller supply; third, to standardize the products of the manufacturers; and fourth, to increase the performance and efficiency of executing the keyboard-commands reading task.

The invention achieves the above-identified objects by providing a new apparatus for reading keyboard-commands of a portable computer. The keyboard comprises a plurality of buttons. The buttons include a plurality of character buttons and a plurality of function buttons. Each button corresponds to a command. The apparatus comprises a shift register, a keyboard-matrix circuit, a filter, a buffer, an address generator, a mapping device, a comparator, and an output device. The shift register is used for outputting a plurality of scan-input signals and a reference signal according to a initial signal and a clock signal. The keyboard-matrix circuit coupled to the shift register is for outputting a scan-output signal according to the scan-input signals. The keyboard-matrix circuit includes a plurality of nodes, and each keyboard button is corresponded to each node. The filter coupled to the keyboard-matrix circuit is for filtering the noise of the scan-output signal. The filter outputs a filter signal according to the scan-output signal. The buffer coupled to the filter is for further stabilizing the filter signal. The buffer outputs a buffer signal according to the filter signal. The address generator coupled to the shift register, and the buffer respectively is for reading the location of the node corresponded to the button being pressed. The address generator device receives the reference signal and outputs an address signal according to the buffer signal and the reference signal. The mapping device coupled to the address generator device is for outputting a mapping signal according to the address signal. The mapping signal is corresponded to the button being pressed. The comparator coupled to the mapping device is for outputting a comparing signal according to the mapping signal and a plurality of status data. The comparator includes a plurality of status storage registers for storing the corresponding status data respectively, and each status storage register is corresponded to one of the function button respectively. The output device coupled to the comparator is for outputting a data clock signal and a data output signal according to the comparing signal.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 5A (Prior Art) illustrates the timing chart of the scan-input signal and the scan-output signal of the keyboard-matrix circuit when the keyboard button is not pressed down;

FIG. 5B (Prior Art) illustrates the timing chart of the scan-input signal and the scan-output signal of the keyboard-matrix circuit when the keyboard button is pressed down;

DESCRIPTION OF THE PREFERRED EMBODIMENTS

Figure 1:
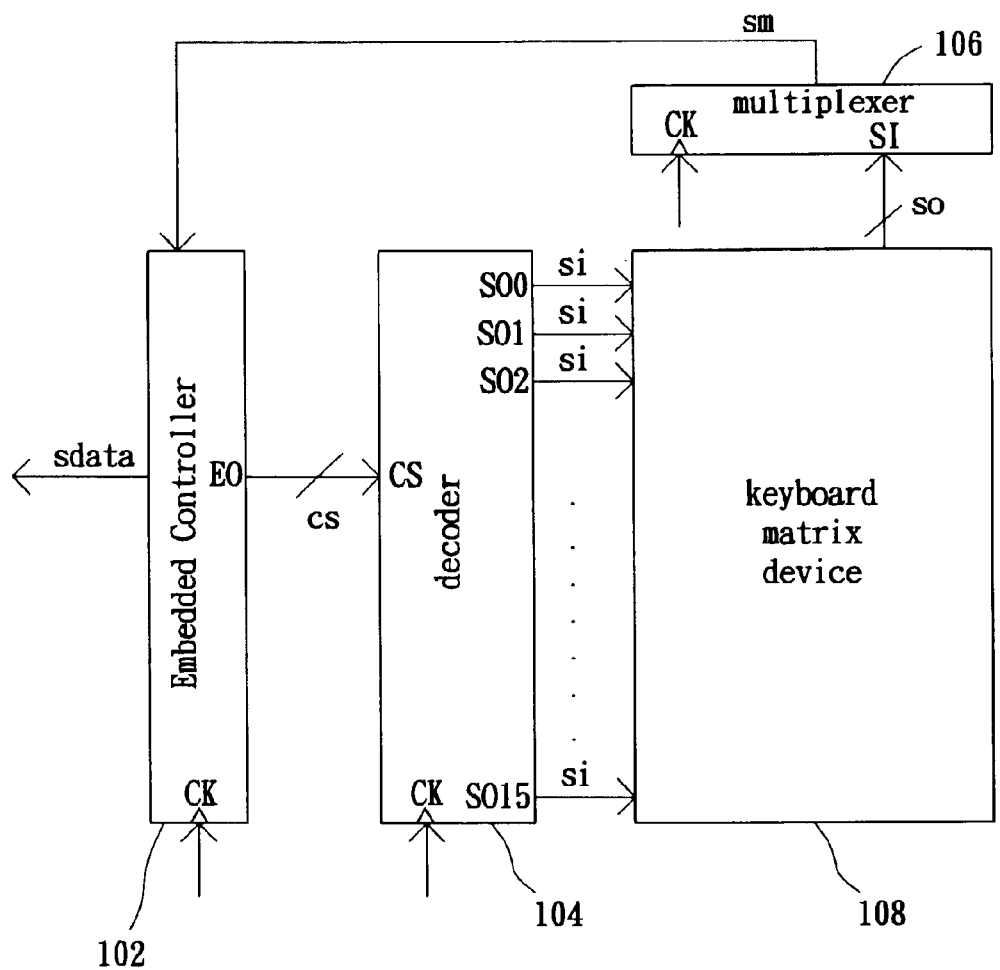
FIG. 1 (Prior Art) illustrates a block diagram of the conventional apparatus for reading the keyboard-commands of the portable computer.
Figure 2:
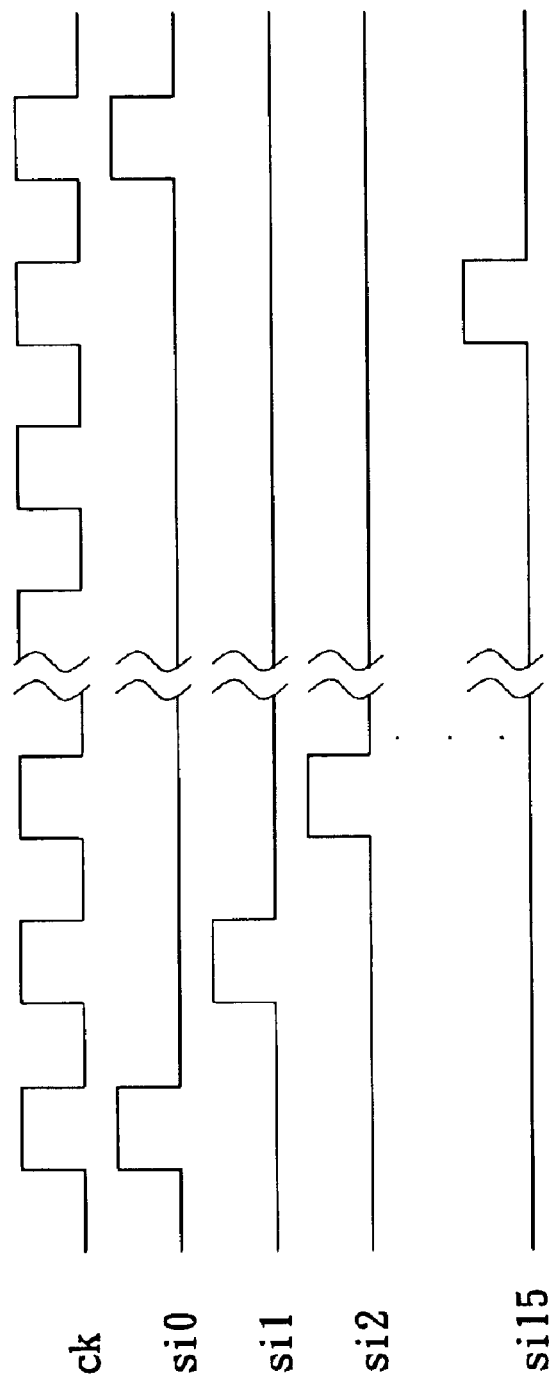
FIG. 2 (Prior Art) illustrates the timing chart of the scan-input signals outputted from the decoder.
Figure 3A:
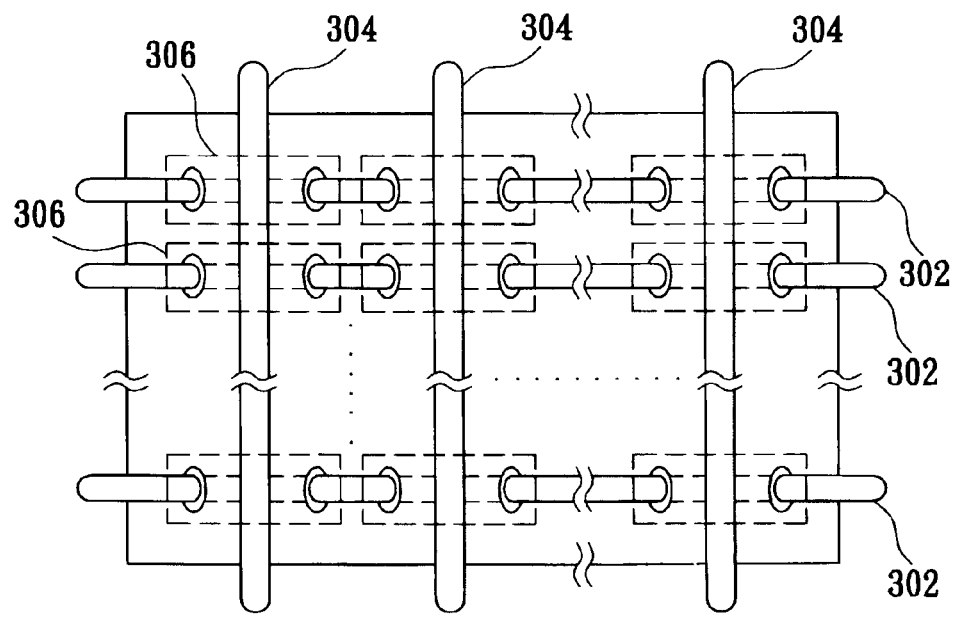
FIG. 3A (Prior Art) illustrates the diagram of the keyboard-matrix circuit.
Figure 3B:
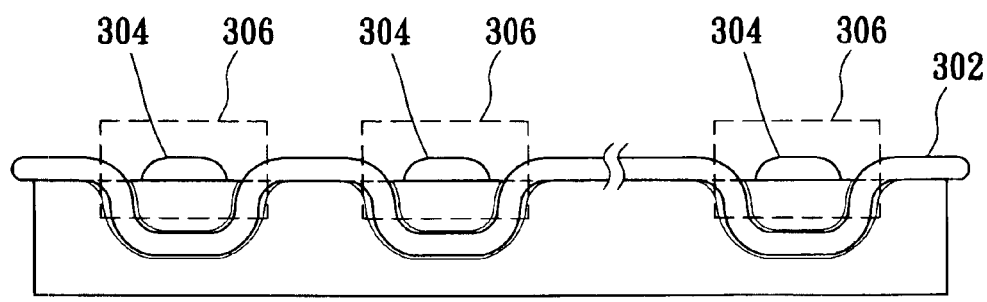
FIG. 3B (Prior Art) illustrates the cross-sectional view of the keyboard-matrix circuit.
Figure 4A:
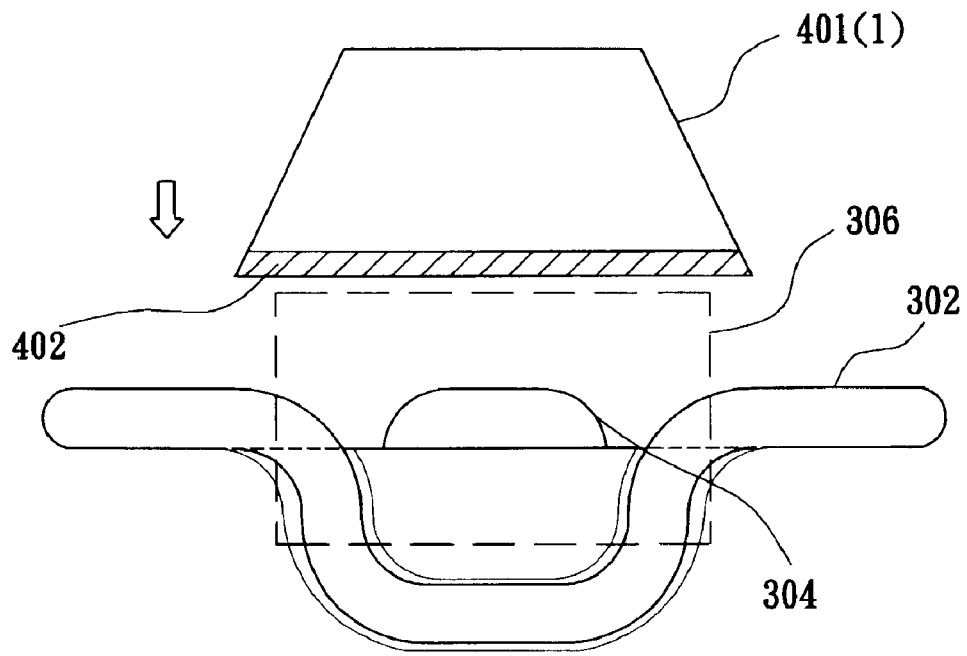
FIG. 4A (Prior Art) illustrates the cross-sectional view of the keyboard button corresponding to the node of the keyboard-matrix circuit when the keyboard button is not pressed down.
Figure 4B:
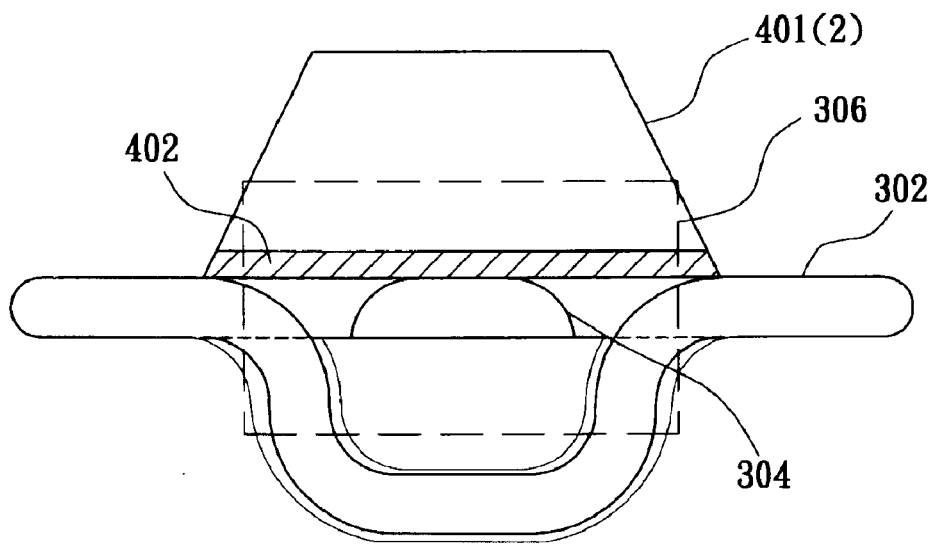
FIG. 4B (Prior Art) illustrates the cross-sectional view of the keyboard button corresponding to the node of the keyboard-matrix circuit when the keyboard button is pressed down.
Figure 6:
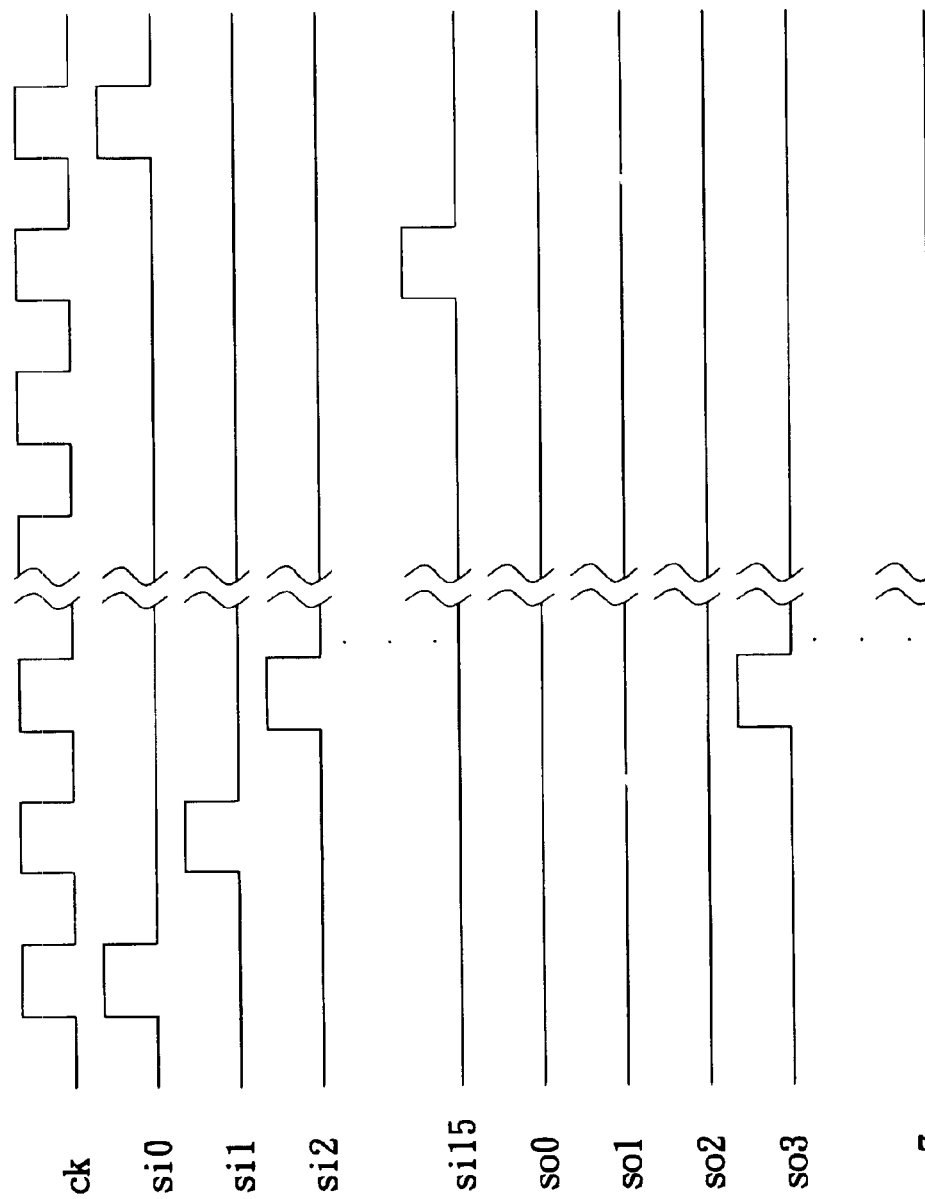
FIG. 6 (Prior Art) illustrates the timing chart of the scan-input signals and the scan-output signals of the keyboard-matrix circuit when one of the keyboard buttons is pressed down.
Figure 7:
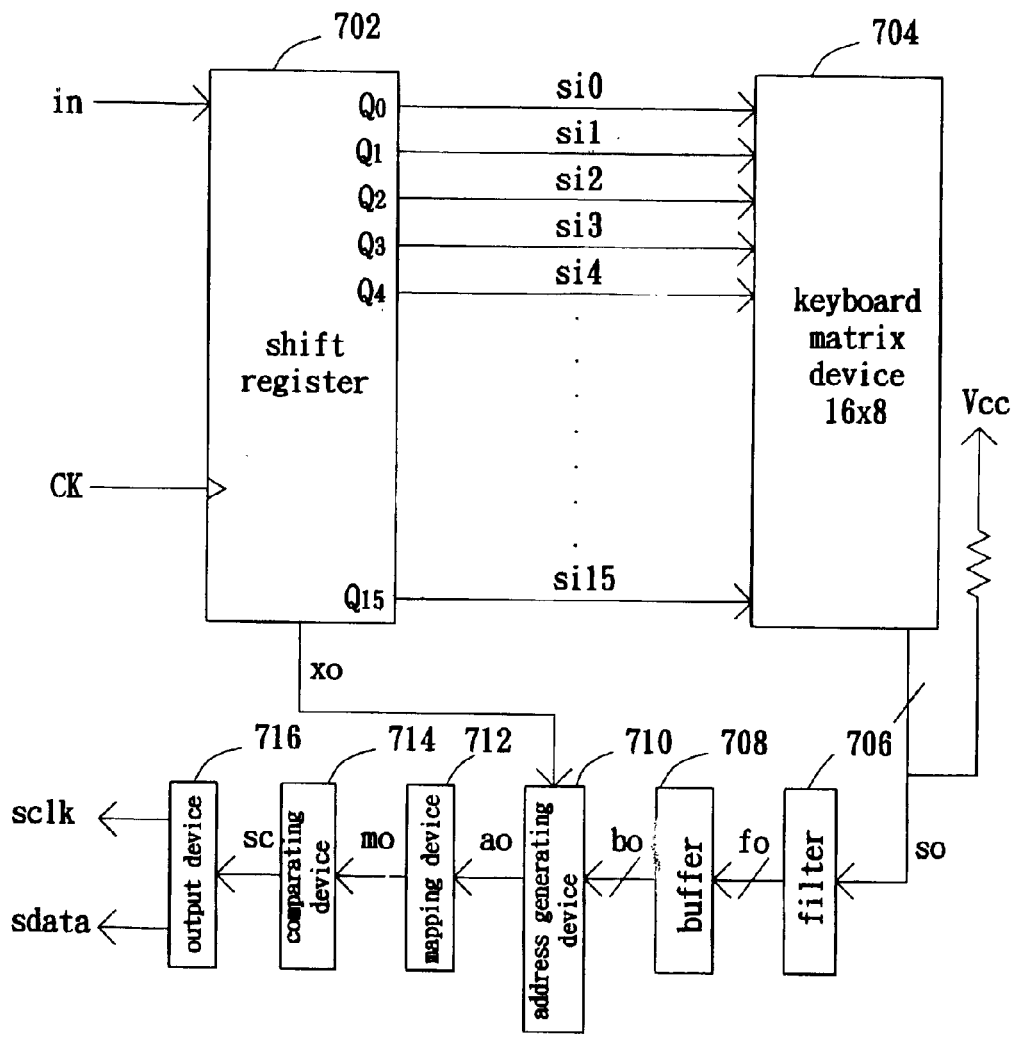
FIG. 7 illustrates the block diagram of the apparatus for reading the keyboard-commands of a portable computer according to a preferred embodiment of the present invention.

FIG. 7 shows a block diagram of the disclosed apparatus for reading the keyboard-commands of a portable computer according to a preferred embodiment of the present invention. The apparatus for reading the keyboard-commands of a portable computer 700 comprises a shift register 702, a keyboard-matrix circuit 704, a filter 706, a buffer 708, an address generator 710, a mapping device 712, a comparator 714, and an output device 716, as shown in FIG. 7.

Figure 8:
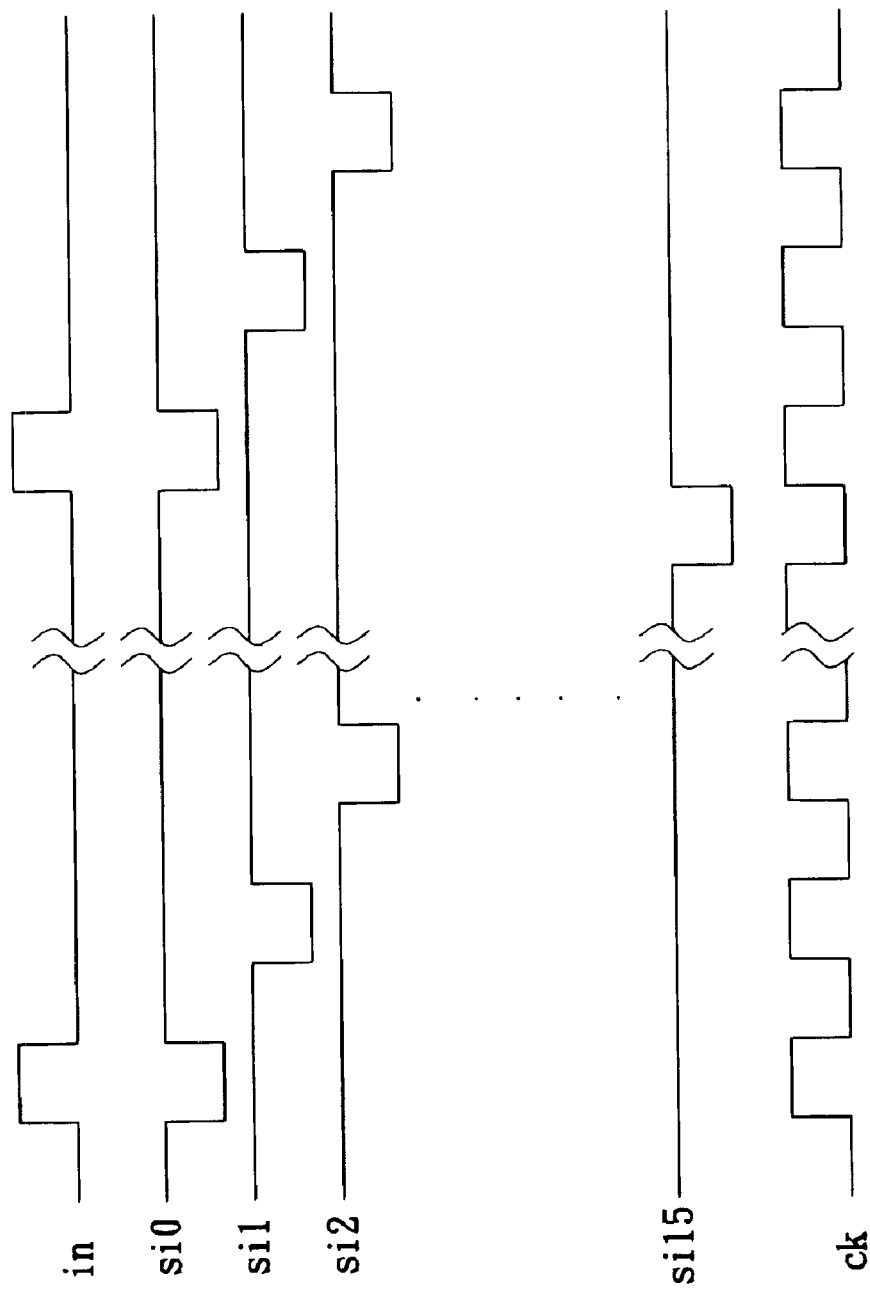
FIG. 8 illustrates the timing chart of the initial signal and the clock signal inputted to the shift register and the scan-input signals outputted from the shift register according to a preferred embodiment of the present invention.

FIG. 8 shows the timing chart of the initial signal (in) and the clock signal (CK) inputted to the shift register 702 and the scan-input signals (si) outputted from the shift register 702 according to a preferred embodiment of the present invention. The initial signal (in) and a clock signal (CK) are input to the shift register 702 for driving the shift register 702. The initial signal (in) is periodically inputted into the shift register 702 every 16 clock periods according to the clock signal (CK). The shift register 702 includes 16 signal output nodes (Q) labeled $Q_0, Q_1, \ldots,$ and $Q_{15}$, respectively. The shift register 702 is used for outputting one scan-input signal (si) from the corresponding signal output node (Q) every clock period. In this embodiment, the initial signal (in) inputted to the shift register 702 is a positive-phase signal and all the scan-input signals (si) outputted from the shift register 702 are negative-phase signals. When receiving the initial signal (in), the shift register 702 outputs the first scan-input signal (si0) from the first signal output node Q0. Then, the shift register 702 outputs the second input signal (si1) from the second signal output node Q1 in the next clock period, and then, the third scan-input signal (si2) from the third signal output node Q2 in the third clock period. In this manner, the shift register 702 outputs a scan-input signal (si) every clock period from the corresponding signal output node (Q) according to the initial signal (in) and the clock signal (CK). The timing chart of the scan-input signals (si) outputted from 16 signal output nodes (Q) of the shift register is shown in FIG. 8.

Each signal output node (Q) of the shift register 702 is coupled to the corresponding horizontal circuit line of the keyboard-matrix circuit 704. The operation of the keyboard-matrix circuit 704 is the same with the conventional keyboard-matrix circuit described above and shown in FIGS. 3A, 3B, 4A, 4B, 5A, and 5B. When one keyboard button is pressed down, a scan-output signal (so) is outputted from the corresponding vertical circuit line to the filter 706.

Figure 9:
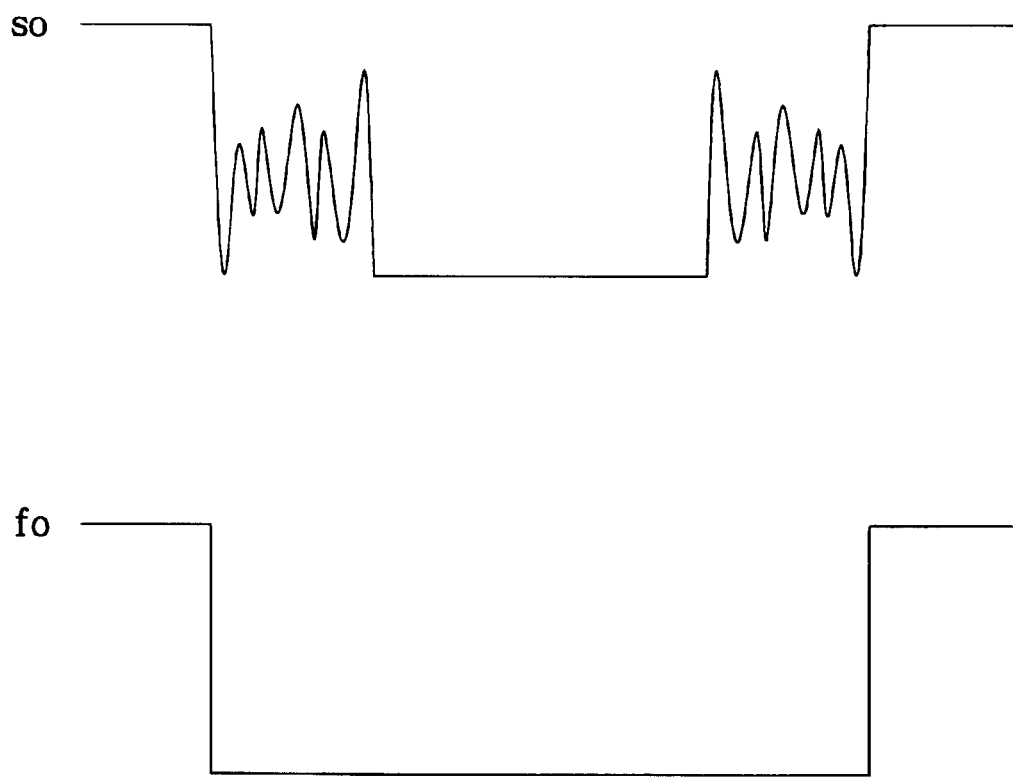
FIG. 9 illustrates the timing chart of the scan-output signal inputted to the filter and the filter signal outputted from the filter.

FIG. 9 shows the timing chart of the scan-output signal (so) inputted into the filter 706 and the filter signal (fo) outputted from the filter 706. In the keyboard-matrix circuit 704, the keyboard button is connected to the soft pad by a spring. When using the keyboard, the force given by the user must be large enough in order to press down the keyboard button. When the keyboard button is not pressed down sufficiently, the keyboard button will oscillate between the original normal position and the pressed down position for a short period of time because of the force of the spring. It affects the coupling relation between the corresponding horizontal circuit line and the vertical circuit line. And the scan-output signal (so) outputted from the keyboard-matrix circuit 704 is not stable when the magnitude of the signal is changed from the high electrical potential to the low electrical potential (when the keyboard button is pressed down) and from the low electrical potential to the high electrical potential (when the keyboard button rebounds automatically), as shown in FIG. 9. Therefore, the filter 706 is coupled to the keyboard-matrix circuit 704 for filtering out the noise of the scan-output signal (so) and increasing the stability of the scan-output signal (so). The filter signal (fo) outputted from the filter 706 is shown in FIG. 9.

The filter 704 includes 8 signal input nodes. Each signal output node of the keyboard-matrix circuit 704 is coupled to the corresponding signal input node of the filter 706 respectively. The filter 706 includes 8 signal output nodes and the buffer 708 includes 8 signal input nodes. Each signal output node of the filter 707 is coupled to the corresponding signal input node of the buffer respectively. The scan-output signal (so) is outputted from one of the signal output nodes of the keyboard-matrix circuit 704, and then is delivered through the filter 706 to the buffer 708. The buffer 708 is used for further increasing the stability of the filter signal (fo). The buffer signal (bo) outputted from the buffer 708 includes a stable high voltage and the stable low voltage.

The address generator 710 is coupled to the shift register 702 and the buffer 708 respectively. Upon receiving the initial signal (in), the shift register 702 outputs a reference signal (xo) to the address generator 710. The address generator 710 includes 8 signal input nodes. Each signal input node of the address generator 710 is coupled to the corresponding signal output node of the buffer 708 respectively. Therefore, each of the scan-output signals (so), outputted from the corresponding scan-output nodes of the keyboard-matrix circuit 704 respectively, is delivered via a different path through the filter 706, the buffer 708, to the corresponding signal input node of the address generator 710 respectively. Because each of the scan-output signals (so) corresponds to one of the vertical circuit line of the keyboard-matrix circuit 704, the address generator 710 knows which vertical circuit line of the keyboard-matrix circuit 704 is electrically-conductive according to the received buffer signal (bo) and which horizontal circuit line of the keyboard-matrix circuit 704 is electrically-conductive according to the time that the address generator 710 received the buffer signal (bo). Therefore, the address of the pressed keyboard button in the keyboard-matrix circuit 704 is known by the address generator 710. Then, the address generator 710 outputs an address signal (ao) according to the corresponding relation between the address of the node in the keyboard-matrix circuit 704 and the address signal (ao) corresponded to the node stored in the memory of the address generator 710 in advance.

The mapping device 712 is coupled to the address generator 710. The corresponding relation between each node in the keyboard-matrix circuit 704 and the corresponding command are stored in the mapping device 712 in advance. The command can be a character or a function. When receiving the address signal (ao), the mapping device 712 will output the corresponding mapping signal (mo) according to corresponding relation stored in the mapping device 712.

The location of keyboard buttons on the keyboard manufactured by each portable computer manufacturer is different. The corresponding relation between each keyboard button and the corresponding node in the keyboard-matrix circuit 704 are different if the keyboards are manufactured by different manufacturer. Therefore, the corresponding relation stored in the mapping device 712 between each node in the keyboard-matrix circuit 704 and the corresponding command must be changed when the keyboard is changed. The mapping device 712 can be a programmable nonvolatile memory in the present invention. Therefore, the corresponding relation between each node in the keyboard-matrix circuit 704 and the corresponding command can be programmed by writing and erasing. In this manner, the corresponding relation between each node in the keyboard-matrix circuit 704 and the corresponding command can be programmable and stored in the mapping device 712 in advance according the type of the keyboard used in the portable computer. Therefore, the apparatus for reading keyboard-commands 700 is suitable for use in all kinds of keyboards and the compatibility of the apparatus for reading keyboard-commands 700 is much better than the conventional keyboard-commands reading apparatus.

If the keyboard buttons of all keyboards manufactured by the same manufacturer are all in the same location on the keyboards, then the mapping device 712 may not necessarily be the programmable nonvolatile memory. It can be a much cheaper nonvolatile memory as well. The demand for this kind of portable computer manufacturers can be satisfied by using nonvolatile memory as the mapping device 712.

The mapping signal (mo) stored in the mapping device 712 includes a first data form, a second data form, and a function status form in this embodiment. The function of each format and the relations among them will be described in detail as follows.

The mapping signal (mo) outputted from the mapping device 712 can be received by the comparator 714. The comparator 714 includes a number of status storage registers. In the portable computer, most of the keyboard buttons are corresponded to two commands. The command corresponded to the keyboard button is different along with the status of some function keys on the portable computer keyboard. By choosing the status of the function keys, the correct command corresponded to the keyboard button is outputted from the keyboard. For example, in the normal situation, when the keyboard button corresponding to the English letter is pressed down, the digital signal outputted from the apparatus for reading keyboard-commands of the portable computer corresponds to the lowercase letter. But when the Caps Lock key is pressed, the same the keyboard button corresponds to the uppercase of the same English letter. When the Caps Lock key is pressed again, the same the keyboard button corresponds to the lowercase English letter again. Therefore, the Caps Lock key is one of the function keys, which can decide whether the uppercase or the lowercase English letter is outputted when the same keyboard button is pressed. In addition to the Caps Lock key, the Num Lock key, the Alt key, the ctrl key, the Home key, the End key, the Insert key, the Delete key, and the Back key, etc. are also function keys which can change the corresponding relation between the keyboard button and the corresponding command.

Besides the function keys listed above, there is another kind of special function keys, Fn key (F1~F12). Each Fn key corresponds to one of the operation statuss of the portable computer system, such as controlling the luminance of the display, the contrast of the frame, the location of the frame, and the loudness of the sounds, etc. Each Fn key has to be pressed with other keyboard buttons to execute the corresponding operation status control task.

The comparator 714 comprises a number of status storage registers. Each status storage register is corresponded to one of the function keys in order to store the toggle status of the corresponding functional key. When receiving the mapping signal (mo) outputted from the mapping device 712, the comparator 714 can decide what is the correct command corresponding to the pressed keyboard button according to the mapping signal (mo) and the toggle status of each functional key stored in the corresponding status storage register of the comparator 714.

The output device 716 is coupled to the comparator 714. When receiving the mapping signal (mo), the output device 716 can output the data clock signal (sclk) and the data output signal (sdata) serially. In this manner, the keyboard-commands reading task has been accomplished by the apparatus for reading the keyboard-commands of the portable computer of the present invention.

The mapping signal (mo) stored in the mapping device 712 comprises a first data form, a second data form, and a function status form in this embodiment. In the following description, two examples illustrate the function of each format of the mapping signal (mo) and the relations among them. All keyboard buttons on the keyboard can be divided in two groups, the character key group and the function key group. The character key group includes the letter keys, the number keys, and the signal keys. The function key group includes the normal functional keys such as Caps Lock key, the Num Lock key, the Alt key, the ctrl key, the Home key, the End key, the Insert key, the Delete key, and the Back key, etc. and the special function keys such as Fn (F1~F12) key.

EXAMPLE 1

When one of the normal function key or character key is pressed, the mapping device 712 can output the mapping signal (mo) according to the corresponding relation between each keyboard button and the command corresponded to the keyboard button. In the portable computer, most of the keyboard buttons are corresponded to two commands. If the keyboard button is corresponded to two commands respectively, then both commands corresponding to the same keyboard button are stored in the first data form and the second data form, respectively. If the keyboard button is corresponded to one command, then the corresponding command is stored in one of the first data form and the second data form. In addition, the function status form can be a data list with the proper length. Each bit of the data list corresponds to one of the function key. For example, whether the Caps Lock key is pressed or not can be represented by "1" or "0" of the corresponding bit in the function status form. When the Caps Lock key is pressed, the corresponding bit of the function status format is "1". Otherwise, the corresponding bit of the function status form is "0" to represent that the Caps Lock key is not pressed. The mapping device 712 outputs the mapping signal (mo) to the comparator 714. Upon receiving mapping signal (mo), the comparator 714 will change the toggle status data stored in the corresponding status storage register according to mapping signal (mo). For example, when the common function key such as the Caps Lock key is pressed, the comparator 714 will change the toggle status data stored in the status storage register corresponded to the Caps Lock key according to mapping signal (mo). When the letter key is pressed, and the first data form and the second data form of the corresponding mapping signal (mo) are corresponded to the uppercase letter and the lowercase letter, respectively. The comparator 714 outputted the corresponding comparing signal (co) according to the mapping signal (mo) and the toggle status data stored in the status storage register corresponded to the Caps Lock key.

EXAMPLE 2

The format of the mapping signal (mo) corresponded to the special functional key, such as Fn key, is different from the character key and the common function key. Each special function key is corresponded to the mapping signal (mo). There is one bit in the function status form of the mapping signal (mo) for representing whether the pressed keyboard button is a special function key or not. In the mapping signal (mo) corresponding to the special functional key, the bit of the function status form is "1". Besides, the command corresponding to the function of the special function key is stored in one of the first data form and the second data form of the mapping signal (mo). When the special functional key is pressed, the comparator 714 will not output the comparing data (sc) to the output device 716. The apparatus for reading keyboard-commands of the portable computer 700 will deliver the command to the computer host by another procedure.

The apparatus for reading the keyboard-commands of the portable computer can be integrated in the chipset of the computer host, such as South Bridge chipset, or coupled to the South Bridge chipset through the I²C bus or set in the form of an integrated circuit.

The apparatus for reading keyboard-commands of the portable computer of the present invention has the following advantages. First, the present invention uses a well-designed logic circuit to execute the keyboard-commandcommand-reading task, instead of using the embedded controller. The portable computer manufacturers do not have to pay royalty to the BIOS manufacturers and the software command codes designing is not necessary either. The time and money cost for the portable computer manufacturer can be decreased. Second, the mapping device of the present invention can be a programmable nonvolatile memory. The corresponding relation between each keyboard button and the corresponding command can be programmable. Therefore, the apparatus for reading keyboard-commands of the present invention is for use in all kinds of keyboard manufactured by different manufacturers and the compatibility of the apparatus for reading keyboard-commands is much better than the conventional keyboard-commands reading apparatus. Third, all logic devices used in the apparatus for reading keyboard-commands of the portable computer are very common and can be purchases easily. Therefore, the shortage of the device supply will not happen again. The manufacturers do not have to design different software command codes to control the apparatus for reading the keyboard-commands of the portable computer manufactured by different manufacturers. In addition, the portable computer manufacturers can standardize the standards of all logic devices used in the apparatus for reading the keyboard-commands of the portable computer to further decrease the time and money cost in manufacturing the portable computer. Fourth, the apparatus for reading keyboard-commands of the portable computer is designed specifically for executing keyboard-command reading task. Therefore, the performance and efficiency of the disclosed apparatus is much better than that of the conventional apparatus in executing the keyboard-commands reading task. Furthermore, the present invention can be integrated in the South Bridge chipset or coupled to the South Bridge chipset through I²C bus. The performance of executing keyboard-commands reading task can be much better in this manner.

While the invention has been described by way of examples and in terms of preferred embodiments, it is to be understood that the invention is not limited to the disclosed embodiments. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for reading keyboard-commands of a portable computer, comprising:
    a shift register for outputting a plurality of scan-input signals and a reference signal according to an initial signal and a clock signal;
    a keyboard-matrix circuit coupled to the shift register for outputting a scan-output signal according to the scan-input signals, wherein said keyboard-matrix circuit includes a plurality of nodes and each of buttons of said keyboard is corresponded to one of said nodes;
    a filter coupled to the keyboard-matrix circuit for filtering noise of the scan output signal, outputting a filter signal according to the scan-output signal;
    a buffer coupled to the filter for further stabilizing said filter signal, outputting a buffer signal according to the filter signal;
    an address generator coupled to the shift register and said buffer respectively for receiving said reference signal and outputting an address signal according to the buffer signal;
    a mapping device coupled to the address generator for outputting a mapping signal according to the address signal;
    a comparator coupled to the mapping device for outputting a comparing signal according to the mapping signal and a plurality of status data, wherein said comparator includes a plurality of status storage registers for storing said corresponding status data respectively; and
    a outputting device coupled to the comparator for outputting a data clock signal and a data output signal according to the comparing signal.

2. The apparatus according to claim 1, wherein said shift register includes a plurality of signal output nodes and each of said scan-input signals is outputted from one of said signal output nodes respectively.

3. The apparatus according to claim 2, wherein each of said scan-input signals is outputted from said different signal output node of said shift register periodically.

4. The apparatus according to claim 2, wherein each of said scan-input signals is outputted in different clock phase.

5. The apparatus according to claim 1, wherein said keyboard-matrix circuit includes a plurality of horizontal circuit lines and a plurality of vertical circuit lines.

6. The apparatus according to claim 5, wherein each of said horizontal circuit lines is coupled to each of said vertical circuit lines respectively in a form of normally open.

7. The apparatus according to claim 6, wherein each of said horizontal circuit lines is coupled to each of said vertical circuit lines in each of said nodes of said keyboard-matrix circuit respectively.

8. The apparatus according to claim 1, wherein each of said horizontal circuit lines is connected to the corresponding signal output node of said shift register respectively.

9. The apparatus according to claim 1, wherein said filter includes a plurality of signal input nodes, and each of said vertical circuit lines of said keyboard-matrix circuit is coupled to the corresponding signal input node of said filter respectively.

10. The apparatus according to claim 9, wherein said filter is used for filtering said noise of said scan-output signals.

11. The apparatus according to claim 1, wherein said filter includes a plurality of signal output nodes, and said buffer includes a plurality of signal input nodes, wherein each of said signal output nodes of said filter is coupled to the corresponding signal input node of said buffer respectively.

12. The apparatus according to claim 1, wherein said buffer includes a plurality of signal output nodes, and said address generator includes a plurality of signal input nodes, wherein each of said signal output nodes of said buffer is coupled to the corresponding signal input node of said address generator respectively.

13. The apparatus according to claim 1, wherein said address generator outputs said address signals according to the reference signal outputted from said shift register and said buffer signal outputted from said buffer.

14. The apparatus according to claim 1, wherein a plurality corresponding relations between address signals received by said mapping device and said mapping signals outputted from said mapping device are stored in said mapping device in advance.

15. The apparatus according to claim 14, wherein each of said mapping signal includes a first data form, a second data form and a functional status form.

16. The apparatus according to claim 14, wherein said corresponding relations between address signals received by said mapping device and said mapping signals outputted from said mapping device stored in said mapping device are programmable.

17. The apparatus according to claim 16, wherein said mapping device is an Electrically Erasable Programmable Read-Only Memory (EEPROM).

18. The apparatus according to claim 16, wherein said mapping device is a Programmable Nonvolatile Memory.

19. The apparatus according to claim 14, wherein said mapping device is a Read-Only Memory (ROM).

20. The apparatus according to claim 1, wherein one of said status data stored in one of said status storage register is corresponded to the toggle status of a Caps Lock button.

21. The apparatus according to claim 1, wherein one of said status data stored in one of said status storage register is corresponded to the toggle status of a Num Lock button.

22. The apparatus according to claim 1, wherein one of said status data stored in one of said status storage register is corresponded to the toggle status of a Shift button.

23. The apparatus according to claim 1, wherein said data clock signal is outputted serially from said output device.

24. The apparatus according to claim 1, wherein said data output signal is outputted serially from said output device.

25. The apparatus according to claim 1, wherein said apparatus for reading keyboard-commands of said portable computer is integrated in a south bridge chipset.

26. The apparatus according to claim 1, wherein said apparatus for reading keyboard-commands of said portable computer is coupled to a south bridge chip set via $I^2C$ bus.

27. The apparatus according to claim 1, wherein said apparatus for reading keyboard-commands of said portable computer is set in a Integrated Circuit (IC).

* * * * *